United States Patent [19]

Doehler

[11] Patent Number: 4,736,304

[45] Date of Patent: Apr. 5, 1988

[54] METHOD AND APPARATUS FOR OPERATING ONE OR MORE DEPOSITION SYSTEMS

[75] Inventor: Joachim Doehler, Union Lake, Mich.

[73] Assignee: Energy Conversion Devices, Inc., Troy, Mich.

[21] Appl. No.: 848,934

[22] Filed: Apr. 7, 1986

[51] Int. Cl.⁴ .................. C23C 13/02; C23C 18/40
[52] U.S. Cl. .................... 364/469; 364/131; 364/138; 364/496; 427/10; 118/695; 118/697; 118/698; 118/712
[58] Field of Search ............... 427/8, 10, 11; 364/131, 364/133, 136, 138, 468, 469, 496; 118/695, 696, 697, 698, 704, 707, 708, 712

[56] References Cited

U.S. PATENT DOCUMENTS

| | | | |
|---|---|---|---|
| 4,152,134 | 5/1979 | Dowling et al. | 364/138 |
| 4,331,702 | 5/1982 | Hieber et al. | 427/10 |
| 4,430,959 | 2/1984 | Ebata et al. | 118/695 |
| 4,550,366 | 10/1985 | Toyama et al. | 364/138 |
| 4,550,375 | 10/1985 | Sato et al. | 364/138 |
| 4,580,207 | 4/1986 | Arai et al. | 364/138 |
| 4,608,661 | 8/1986 | Sasaki | 364/131 |
| 4,623,554 | 11/1986 | Kaschak et al. | 427/10 |

Primary Examiner—Michael R. Fleming
Assistant Examiner—John R. Lastova
Attorney, Agent, or Firm—Marvin S. Siskind; Richard M. Goldman

[57] ABSTRACT

There are disclosed a method and apparatus for improved operation of one or more deposition systems. A minimum expenditure malfunction recovery system provides for a variable recovery related to the current hardware and actual states of the system. A simplified input and output (I/O) device is provided to control the data flow in the system without addressing and decoding complexity. A flexible operation system is also provided for a plurality of deposition systems whose operation easily can be varied without reprogramming of the operating sequence.

7 Claims, 7 Drawing Sheets

PRIOR ART

METHOD AND APPARATUS FOR OPERATING ONE OR MORE DEPOSITION SYSTEMS

BACKGROUND OF THE INVENTION

This invention relates to a method and apparatus for operating one or a plurality of deposition systems. The invention has application with any microwave deposition system, but has particular applicability for plasma-type systems, such as those incorporating amorphous semiconductor alloys. The invention includes a method and apparatus for making such devices by plasma deposition from reaction gases wherein the plasmas are excited by microwave energy. The invention has one of its most important applications in making commercial electrophotographic devices having a cylindrical or drum configuration with the amorphous semiconductor alloys coated or deposited on the outer surfaces thereof. The present invention enhances the commercial mass production of deposition systems, such as utilized for electrophotographic drums incorporating amorphous semiconductor alloys.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientists to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films could not be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane ($SiH_4$) was passed through a reaction tube where the gas was decomposed by an radio frequency (RF) glow discharge and deposited on a substrate at a substrate temperature of about 500°–600° K. (227°–327° C.). The material so deposited on the substrate was an intrinsic amorphous material consisting of silicon and hydrogen. To produce a doped amorphous material, a gas of phosphine ($PH_3$) for n-type conduction or a gas of diborane ($B_2H_6$) for p-type conduction was premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above RF deposition method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the RF silane deposited materials leads to a narrow depletion width, which in turn limits the efficiencies of solar cells and other devices whose operation depends on the drift of free carriers. The RF method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above-described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a lower density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

About forty-five years ago, C. Carlson developed the first electrophotographic process based on a sulfur material. Other chalcogenides such as selenium and selenium alloys were thereafter suggested for such applications together with organic substances such as polyvinyl carbazole (PVK). These materials, however, exhibited certain deficiencies. They were toxic, and therefore difficult to handle, soft, and therefore subject to wear, and had poor infrared light photoresponse.

In view of the above noted deficiencies of these materials, silicon based amorphous semiconductor alloys were investigated for possible applications in electrophotographic processes. These materials were considered likely to be useful because of the hardness of amorphous silicon alloys, because of their nontoxic nature, and because of their improved photoresponse to infrared light. Also, as previously mentioned, these materials could be made with a density of states reduced to a point where charging of the materials to the potentials required for electrophotographic replication was considered possible. Thus, amorphous semiconductor alloys made by the processes hereinabove described have demonstrated photoresponsive and structural characteristics which are suited for electrophotographic applications. These prior art processes, however, have suffered from relatively slow deposition rates and low conversion efficiency of the reaction gas feed stock which are important considerations from the standpoint of using amorphous semiconductor materials on a commercial basis.

A new and improved process for making electrophotographic devices incorporating amorphous semiconductor alloys is disclosed in U.S. application Ser. No. 580,081, filed Feb. 14, 1984 for "An Improved Method Of Making A Photoconductive Member And Improved Photoconductive Members Made Thereby", filed in the names of Annette G. Johncock and Stephen J. Hudgens, which is incorporated herein by reference. The process described therein is a microwave glow discharge deposition process which provides substantially increased deposition rates and reaction gas feed stock utilization. Among the many applications for amorphous semiconductor alloys, high deposition rates and reaction gas feed stock conversion efficiency and utilization are most essential for the commercial viability of electrophotographic devices utilizing such materials. High deposition rates and feed stock conversion efficiency and utilization are necessary because layer thicknesses of about 15 microns or more of amorphous semiconductor alloy are required in such devices to enable sufficient surface potential, about 350 volts, to be applied thereto. As a result, amorphous semiconductor alloys can be deposited at sufficient rates and have desired photoresponsive characteristics to enable the commercial utilization of such materials in electrophotographic devices.

The electrophotographic devices used in commercial practice usually take the form of cylindrical or drum members. An apparatus and method which facilitates the deposition of amorphous semiconductor alloys uniformly over the entire outer surface of such drums to form electrophotographic devices thereon is disclosed in U.S. application Ser. No. 580,086, also filed Feb. 14, 1984, for "Method And Apparatus For Making Electrophotographic Devices", filed in the names of Eugene W. Fournier, Erik J. Bjornard, Annette G. Johncock and Joachim Doehler, which is incorporated herein by reference. At the same time, all of the advantages of microwave glow discharge processes including high reaction gas feed stock utilization can be realized. The present invention provides a method and apparatus for operating one or a plurality of deposition systems to enhance the microwave glow discharge process which can be utilized in making the above electrophotographic devices.

SUMMARY OF THE INVENTION

The invention provides a method and apparatus for improved operation of one or more deposition systems. One embodiment of the invention includes an enhanced malfunction method and system for operating one or more deposition systems with a minimum expenditure of resources when a malfunction occurs. The invention provides for a variable recovery from any malfunction which occurs instead of a totally fixed recovery sequence which is wasteful and can be hazardous. A second embodiment of the invention provides a simplified input and output (I/O) method and apparatus for controlling the data flow between the generating system and the deposition system or deposition subsystem. A further embodiment of the invention provides a flexible operating system for a plurality of deposition systems to provide an easily variable operating system which does not have to be continually reprogrammed. One particular utilization of the invention is with making electrophotographic devices incorporating amorphous semiconductor alloys as described in the above-referenced, copending applications.

Copending application Ser. No. 580,086 provides a method and apparatus for depositing a layer of material onto the outer surface of at least a pair of cylindrical members. The method includes the steps of forming an inner chamber including the pair of cylindrical members by aligning the members with the longitudinal axes thereof disposed substantially parallel and the outer surfaces of the members closely spaced apart to form the inner chamber and a narrow passage communicating with the inner chamber between the members. The method further includes the steps of introducing at least one reaction gas into the inner chamber through the narrow passage, wherein, the at least one reaction gas includes at least one element to be deposited, and forming a plasma from the at least one reaction gas within the inner chamber to deposit the layer of material containing the at least one element onto the outer surface of the cylindrical members.

The inner chamber can be formed by forming a substantially closed loop of a plurality of the cylindrical members by aligning the members with the longitudinal axes thereof disposed substantially parallel and the outer surfaces of adjacent members closely spaced apart to form the inner chamber substantially closed and a narrow passage between adjacent members communicating with the inner chamber. The at least one reaction gas is then introduced into the inner chamber through at least one of the narrow passages.

The reaction gases can include silane ($SiH_4$), silicon tetrafluoride ($SiF_4$), germane ($GeH_4$), germanium tetrafluoride ($GeF_4$), diborane ($B_2H_6$), boron trifluoride ($BF_3$), phosphine ($PH_3$), phosphorus pentafluoride ($PF_5$), ammonia ($NH_3$), nitrogen ($N_2$), oxygen ($O_2$) and methane ($CH_4$) or combinations thereof. The plasma within the inner chamber can be formed by coupling microwave energy or radio frequency energy into the inner chamber through a microwave transmission window.

Ser. No. 580,086 provides an apparatus for depositing a layer of material onto the outer surfaces of at least a pair of cylindrical members. The apparatus includes a substantially closed deposition chamber, means for aligning the members with the longitudinal axes thereof disposed substantially parallel with the outer surfaces of the members closely spaced apart to form a substantially closed inner chamber within the deposition chamber and a narrow passage communicating with the inner chamber between the members. The apparatus further includes means for introducing at least one reaction gas into the inner chamber through the narrow passage wherein the at least one reaction gas includes at least one element to be deposited onto the outer surfaces of the members. The apparatus further includes means for forming a plasma from the at least one reaction gas within the inner chamber to deposit the layer of material containing the at least one element onto the outer surface of the cylindrical members.

The apparatus can include means for aligning a plurality of the cylindrical members in a substantially closed loop with the longitudinal axes thereof disposed substantially parallel and the outer surfaces of adjacent members closely spaced apart to form the substantially closed inner chamber and a narrow passage between each pair of members communicating with the inner chamber. The reaction gas introducing means are arranged to introduce the reaction gas into the inner chamber through at least one of the narrow passages.

The plasma-forming means includes means for coupling microwave energy into the inner chamber through a microwave transmission window. To facilitate the uniform deposition onto the outer surfaces of the cylindrical members, the apparatus can further include means for rotating the cylindrical members about their own longitudinal axes and means for rotating the microwave energy polarity. The reaction gas introducing means preferably include means for introducing the reaction gas into the inner chamber through at least one of the narrow passages and means for pumping unused reaction gases from the inner chamber through at least one narrow passage other than the narrow passage through which the reaction gas is introduced into the inner chamber.

DETAILED DESCRIPTION OF THE PREFERRED EMBODIMENTS

FIGS. 1 through 5 describe the method and apparatus claimed in copending application, U.S. Ser. No. 580,086. The applicability of Ser. No. 580,086 to the present invention is described with respect to FIGS. 1 through 5 and the additional new disclosure and structures of the present invention are more particularly described with respect to FIG. 6 and the figures and specification thereafter.

Figure 1:
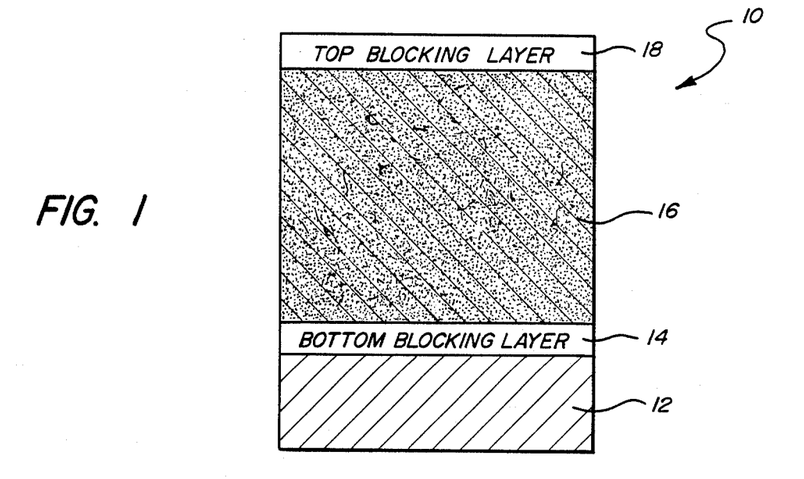
FIG. 1 is a partial cross-sectional view of a cylindrical member having materials deposited thereon in accordance with Ser. No. 580,086 wherein the deposited materials adapt the cylindrical member for use as an electrophotographic device which can embody the present invention.

Referring now to FIG. 1, it illustrates, in partial cross-sectional side view, an electrophotographic device 10 of the type which can be formed utilizing the present invention by depositing various materials onto the outer surface of a cylindrical member 12. The cylindrical member 12 forms the substrate of the electrophotographic device 10. The device 10 includes a first blocking layer 14 deposited onto the substrate 12, a photoconductive layer 16 deposited onto the first blocking layer 14, and a second blocking layer 18 deposited onto the photoconductive layer 16. The photoconductive layer 16 preferably is formed from an amorphous semiconductor alloy and more particularly, an amorphous silicon alloy containing silicon and hydrogen and/or fluorine. Depending upon the type of blocking layers 14 and 18 selected, and the type of charge utilized in charging the device 10, the photoconductive region 16 can also include small amounts of a dopant such as boron to provide the region 16 with substantially intrinsic properties. Similarly, the photoconductive region 16 can be rendered slightly n-type without any dopant included.

The bottom blocking layer 14 is provided to preclude charge injection from the substrate 12 into the photoconductive region 16. To that end, the bottom blocking layer 14 can be made insulative when formed from an amorphous alloy including silicon and carbon, silicon and oxygen, or silicon and nitrogen. In forming such bottom blocking layers, reaction gas mixtures of silane ($SiH_4$) and/or silicon tetrafluoride ($SiF_4$) with methane ($CH_4$), ammonia ($NH_3$), nitrogen ($N_2$) or oxygen can be used. Such blocking layers are suitable for both positive and negative charging of the electrophotographic device 10.

If positive charging of the electrophotographic device 10 is desired, the bottom electron blocking layer 14 can be, for example, a p-type amorphous silicon alloy formed from reaction gas mixtures including silane and/or silicon tetrafluoride with a p-type dopant-containing compound such as diborane ($B_2H_6$) or boron trifluoride ($BF_3$). In this case, it is also preferred that the photoconductive region 16 be formed from an amorphous silicon alloy which includes a small amount of p-type dopant achieving substantially intrinsic properties.

If negative charging is desired, the bottom hole blocking layer can be, for example, an amorphous silicon alloy which is n-type. To form such a blocking layer, reaction gas mixtures of silane and/or silicon tetrafluoride with an n-type dopant-containing compound, such as phosphine ($PH_3$) or phosphorus pentafluoride ($PF_5$) can be used. In this case, the photoconductive layer 16 is preferably formed from an amorphous silicon alloy which is slightly n-type.

The top blocking layer 18 can be formed from any of the materials mentioned with respect to the bottom blocking layer 14. Hence, the top blocking layer can be formed from an insulative material or a p-type or n-type amorphous semiconductor alloy as previously described above. For further details with respect to specific examples of some of the configurations and materials of electrophotographic devices of the type which can be made by utilizing the present invention, reference can be had to the aforementioned copending U.S. patent application Ser. No. 580,081.

As disclosed in the above-mentioned copending application, the photoconductive region 16 preferably is thick in dimension, being on the order of 10 to 25 microns thick to facilitate a sufficient surface potential characteristic of the device. As also disclosed in that application, in order to make such devices on a commercial basis, it is necessary to deposit the materials forming the photoconductive region 16 by a method which exhibits high deposition rates. Conventional radio frequency glow discharge deposition techniques are not suitable for forming the entire 10 to 25 microns thick photoconductive region 16. However, as disclosed in the aforementioned copending application, microwave energy excited glow discharge plasmas facilitate the deposition of the photoconductive region 16 at deposition rates which render such devices commercially viable. The apparatus and method of the present invention contemplate an improved utilization of microwave energy for forming a plasma from which the materials of the electrophotographic device can be deposited at such commercially viable rates and with gas feed stock utilization not heretofore possible.

The photoconductive region 16 can be formed from both microwave and radio frequency glow discharge plasmas or radio frequency energy could be utilized to ignite the plasma. In the case of utilizing radio frequency to deposit a portion of the region 16, the major portion of the photoconductive region 16 can be formed from the microwave energy glow discharge plasma and the remaining or top portion of the photoconductive region 16 can then be formed from the radio frequency glow discharge plasma. The apparatus and method accommodates both modes of operation in order to facilitate the making of electrophotographic copier drums having desired photoresponsive and charge retention characteristics to render the devices especially useful for electrophotographic copying.

Figure 2:
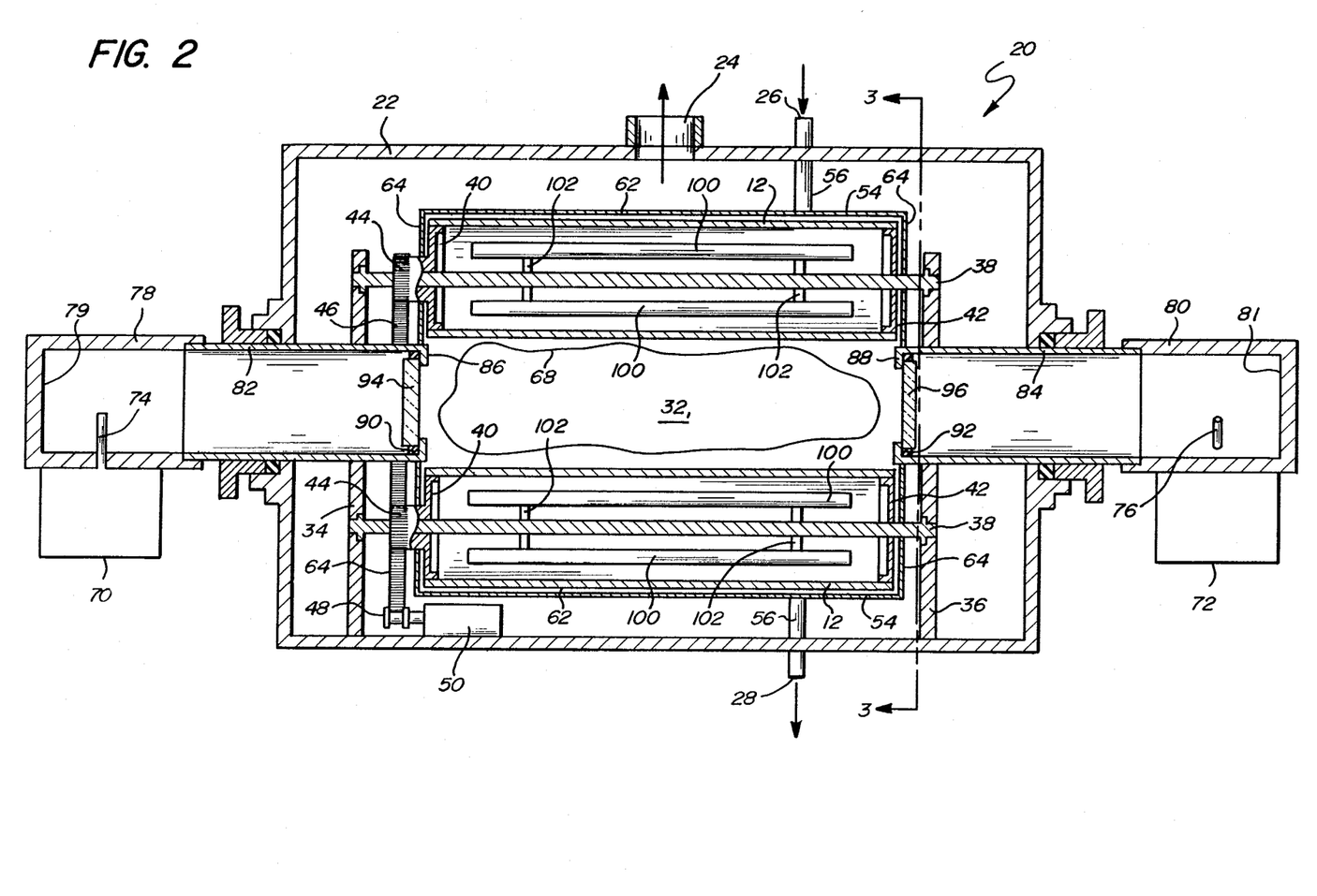
FIG. 2 is a side view partly in cross section of an apparatus in accordance with Ser. No. 580,086 which can embody the present invention.
Figure 3:
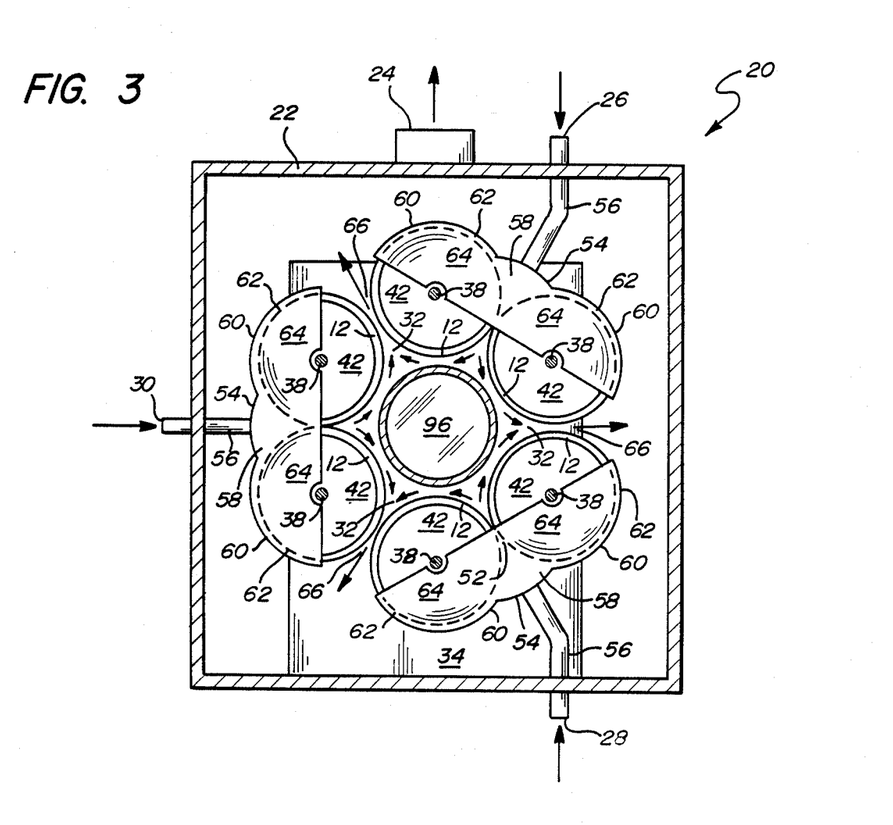
FIG. 3 is a cross-sectional view taken along lines 3—3 of FIG. 2.

Referring now to FIGS. 2 and 3, they illustrate an apparatus 20, which can embody the present invention adapted for depositing a layer or layers of material, preferably amorphous semiconductor alloys, onto a plurality of drums or cylindrical members 12. The apparatus 20 includes a deposition chamber 22. The chamber 22 includes a pump-out port 24 adapted for suitable connection to a pump for pumping out reaction products from the chamber and to maintain the interior of the chamber at an appropriate pressure to facilitate the deposition process therein. The chamber 22 further includes a plurality of reaction gas input ports 26, 28, and 30 through which reaction gases are introduced into the deposition environment in a manner to be described hereinafter.

Within the chamber 22, there are supported a plurality of cylindrical members or drums 12. The drums 12 are arranged to form a substantially closed loop with the longitudinal axes of the drums being disposed substantially parallel and the outer surfaces of adjacent drums being closely spaced apart to form an inner chamber 32. For disposing the drums 12 in this manner, the chamber 22 includes a pair of upstanding walls 34 and 36 which support thereacross a plurality of stationary shafts 38. Each of the drums 12 is mounted for rotation on a respective one of the shafts 38 by a pair of disc-shaped spacers 40 and 42. The spacers 40 and 42 have an outer dimension corresponding to the inner dimension of the drums 12 to thereby make frictional engagement with the inner surfaces of the drums 12 for accurately positioning the drums with respect to one another. The spacers 40 include a sprocket 44 arranged to engage a drive chain 46. The drive chain 46 makes a continuous loop around the sprockets 44 and a drive sprocket 48 of a motor 50. Although the drums 12 are illustrated as having the support and drive mechanisms within the chamber 22, this structure can be external to the chamber 22 with appropriate vacuum feedthrough seals where desired. As a result, and as will be further explained hereinafter, during the deposition process the motor 50 is energized to cause each of the drums 12 to be rotated about its own longitudinal axis. This facilitates a uniform deposition of the material being deposited over the entire outer surface of each of the drums 12.

As previously mentioned, the drums 12 are disposed so that the outer surfaces thereof are closely spaced apart to form the inner chamber 32. As can be noted in FIG. 3, the reaction gases from which the deposition plasma is formed are introduced into the inner chamber 32 through at least one of a plurality of narrow passages 52 formed between one pair of adjacent drums 12. Preferably, the reaction gases are introduced into the inner chamber 32 through every other one of the narrow passages 52.

Referring to FIG. 3, it can be seen that the plasma is confined within the inner chamber 32. The plasma changes in intensity as the surfaces of the drums 12 are rotated into and then out of the chamber 32. This can result in defects being formed in the weaker plasma regions in or adjacent the narrow passages 52. To avoid the possibility of a large plurality of defect regions or defect layers being formed as the material is deposited on the surface of the rotating drums 12, the drums 12 can be rotated a single or several revolutions to achieve a deposited high quality material of the thickness desired. For example, the drums 12 may only be rotated a single revolution to deposit the required material thickness to form the bottom blocking layer 14.

In FIG. 3, it can be noted that each pair of adjacent drums 12 is provided with a gas shroud 54. Each shroud 54 is connected to one of the reaction gas inlets 26, 28, and 30 by a conduit 56. Each shroud 54 defines a reaction gas reservoir 58 adjacent the narrow passage through which the reaction gas is introduced. The shrouds 54 further include lateral extensions 60 which extend from opposite sides of the reservoirs 58 and along the circumference of the drums 12 to form narrow channels 62 between the shroud extensions 60 and the outer surfaces of the drums 12.

The shrouds 54 are configured as described above so that the gas reservoirs 58 permit relatively high reaction gas conduction while the narrow channels 62 provide a high resistance or low conduction of the reaction gases. Preferably, the vertical conductance of the reaction gas reservoirs 58 is much greater than the conductance of the narrow passages 52 between the drums. Further, the conductance of the narrow passages 52 is much greater than the conductance of the narrow channels 62. This assures that a large percentage of the reaction gas will flow into the inner chamber 32 and uniform gas flow along the entire lateral extent of the drums 12.

The shrouds 54 further include side portions 64 which overlap end portions of the drums 12 and spacers 42 and 44. The side portions 64 are closely spaced from the end portions of the drums 12 and spacers 42 and 44 to continue the narrow channels 62 across the ends of the drums. The side portions 64 thereby impede reaction gas flow around the ends of the drums. It has been discovered that the apparatus 20 can be utilized without the shrouds 54.

As can also be noted in FIG. 3, in accordance with this embodiment, the narrow passages 66 which are not utilized for reaction gas introduction into the inner chamber 32 are utilized for conducting reaction products from the inner chamber 32 and the chamber 22. When the pump which is coupled to the pump-out port 24 is energized, the interior of the chamber 22 and the inner chamber 32 is pumped out, with the inner chamber being pumped out through the narrow passages 66. In this manner, reaction products can be extracted from the chamber 22 and the interior of the inner chamber 32 can be maintained at a suitable pressure for deposition.

To facilitate the formation of the deposition plasma identified by reference character 68 in FIG. 2, the apparatus 20, in accordance with this preferred embodiment, further includes a first microwave energy source 70 and a second microwave energy source 72. Each of the microwave energy sources 70 and 72 includes an antenna stub 74 and 76, respectively. The microwave energy sources 70 and 72 can be, for example, microwave frequency magnetrons having an output frequency of, for example, 2.45 GHz. The magnetrons 70 and 72 are mounted to a cylindrical waveguide structure 78 and 80, respectively. The stubs 74 and 76 are spaced from back walls 79 and 81 of the waveguides 78 and 80 by a distance of about one-quarter of the waveguide wavelength. This spacing maximizes the coupling of the microwave energy from the stubs to the waveguides. The waveguide structures 78 and 80 are mounted for rotation onto another waveguide 82 and 84, respectively. The waveguides 82 and 84 project into the chamber 22 and terminate in close proximity to the edge portions of the drums 12. The end portions of the waveguides 82 and 84 include a lip portion 86 and 88. Against each of the lip portions 86 and 88 is disposed a sealing O-ring 90 and 92 each of which, together with the lip portions 86 and 88, supports a respective microwave transmission window 94 and 96. The transmission windows 94 and 96 together with the drums 12 define the substantially closed inner chamber 32. The present invention can be utilized to maximize and stabilize the microwave power transmitted through the windows 94 and 96.

The waveguides 78 and 82 form a coupling means for coupling the microwave energy generated by the magnetron 70 into the inner chamber 32. Similarly, the waveguides 80 and 84 define a coupling means for coupling the microwave energy generated by magnetron 72 into the inner chamber 32. The microwave energy generated by the magnetrons 70 and 72 is radiated by the antenna stubs 74 and 76, which determine the polarization of the radiated microwave energy. In order to avoid interaction between the stubs 74 and 76, the antenna stubs preferably are displaced from each other by an angle. In accordance with this preferred embodiment, the angle between the stubs is about 60°. However, for systems incorporating a greater number of drums than the six drums illustrated herein, the angle of displacement between the antenna stubs 74 and 76 will vary. The reason for this is that it is preferred that the antenna stubs be disposed with respect to the drums 12, so that each stub forms an identical and uniform microwave energy field within the inner chamber 32.

The windows 94 and 96, in addition to enclosing the inner chamber 32, protect the magnetrons 70 and 72 from the reaction gases. They further serve to preclude the formation of a plasma at the magnetron probes 74 and 76 and they also provide a low loss coupling of the microwave energy into the inner chamber 32. To that end, the windows 94 and 96 can be formed from a material such as alumina, and have a thickness which provides low reflected power into the waveguides 82 and 84.

To further diminish the interaction between the magnetrons 70 and 72, each magnetron can be energized sequentially. For example, if alternating current is being utilized to energize the magnetrons, the magnetrons can be energized during alternate half cycles of the alternating current. In this manner, the interaction between the magnetrons can be further diminished.

As previously mentioned, the waveguides 78 and 80 are mounted for rotation on their respective waveguides 82 and 84. As a result, each of the magnetron sources 70 and 72 can be rotated about the longitudinal axis of the waveguides 82 and 84 to rotate the polarity of the microwave energy to even out the microwave field. Such rotation assures that the time average density of depositing species is radially uniform. The polarization could also be circular to even out the field.

In utilizing the apparatus 20 of FIGS. 2 and 3 for depositing a material onto the outer surfaces of the drums 12, and more particularly for depositing layers of materials to form electrophotographic copier drums, the drums 12 are first mounted as illustrated and as described above. Thereafter, reaction gases are introduced through the inlet ports 26, 28, and 30 while the chamber 22 is pumped out by the pump coupled to the outlet 24. With the reaction gases introduced into the inner chamber 32, the magnetrons 70 and 72 are then energized to couple microwave frequency energy into the inner chamber 32 to form a glow discharge plasma therein. The microwave energy is readily coupled into the inner chamber 32, because the inner chamber itself defines a waveguide structure at microwave frequencies.

The motor 50 is then energized to cause the drums 12 to be rotated about their own longitudinal axes. The magnetrons 70 and 72 can then also be rotated about the waveguides 82 and 84 as previously described. As a result of the foregoing, a uniform deposition of material will ensue upon the entire outer surfaces of the drums 12.

During the deposition process, it may be desirable to heat the drums 12. To that end, the apparatus 20 further includes a plurality of heating elements 100 which are mounted to the stationary shafts 38 by spacers 102. Since the shafts 38 are stationary, the heating elements 100 will also be stationary within the drums 12. The heaters 100 can take the form of resistance heating elements or incandescent lamps. For the deposition of amorphous semiconductor alloys, the drums are preferably heated to a temperature between 20° C. and 400° C., and preferably, about 300° C. It can also be desirable to preheat the reaction gases prior to introduction thereof into the inner chamber 32. This can be accomplished, for example, by heating the shrouds 54 to about 300° C. by slug heaters incorporated therein or lamps disposed adjacent the shrouds 54 external to the deposition region.

For making an electrophotographic drum as illustrated in FIG. 1, the first blocking layer 14 as previously described can be formed from an insulative material, a p-type amorphous silicon alloy, or an n-type amorphous silicon alloy. When the blocking layer 14 is formed from an insulative material such as silicon nitride, silicon carbide, or silicon dioxide, the reaction gases introduced into the inner chamber during the deposition process can be silane ($SiH_4$) and/or silicon tetrafluoride ($SiF_4$) with methane, nitrogen, ammonia, or oxygen. Such a blocking layer can be utilized for both positive and negative charging of the electrophotographic drum.

When the blocking layer 14 is a p-type amorphous silicon alloy, the reaction gases introduced into the inner chamber 32 can be silane and/or silicon tetrafluoride with diborane or boron trifluoride. Such a blocking layer is suitable for an electrophotographic drum to be positively charged.

When the blocking layer 14 is to be formed from an n-type amorphous silicon alloy, the reaction gases introduced into the inner chamber can be silane and/or silicon tetrafluoride and phosphine or phosphorus pentafluoride gas. Such a blocking layer is suitable for an electrophotographic device to be negatively charged.

For making the photoconductive region 16, the photoconductive region 16 can be an amorphous silicon alloy incorporating silicon, hydrogen, and/or fluorine. Such a material can be deposited from reaction gases of silane, and/or silicon tetrafluoride, and hydrogen. If the photoconductive region is to be rendered substantially intrinsic, boron trifluoride or diborane gas can also be utilized. If it is to be slightly n-type, no dopant is utilized.

In some instances, as fully described in cross-referenced Ser. No. 580,081, it may also be desirable to incorporate a layer of material in the photoconductive region 16 towards the top thereof which has a more narrow band gap than the bulk of the photoconductive region. To deposit such a material, germane ($GeH_4$) or germanium tetrafluoride ($GeF_4$) gas can also be introduced into the inner chamber 32. The germane or germanium tetrafluoride together with the silane and/or silicon tetrafluoride will form an amorphous silicon germanium alloy having a reduced band gap for infrared photoresponsive applications. Also, as fully described in cross-referenced Ser. No. 580,081, a top blocking enhancement layer can be deposited before the top blocking layer 18 by RF deposition.

Figure 4:
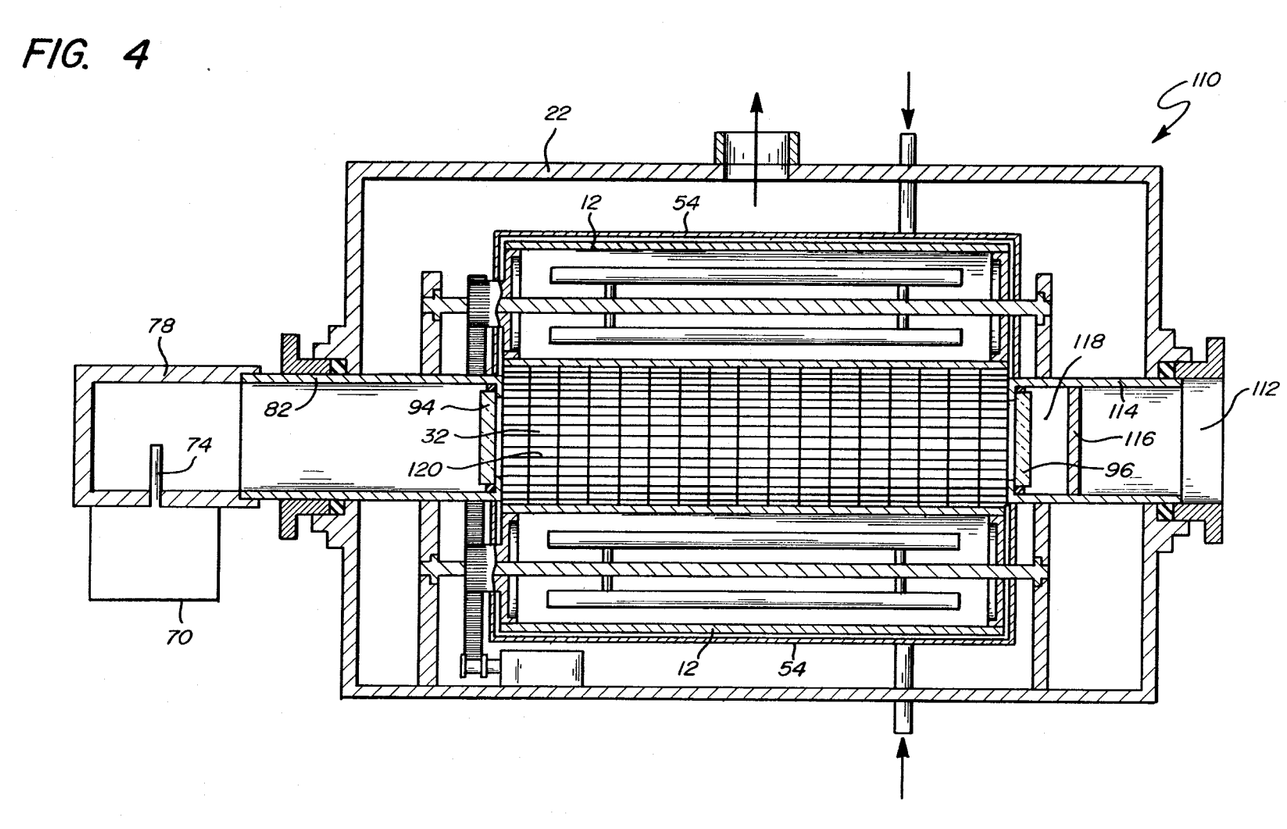
FIG. 4 is a side view, partly in cross section, of another apparatus in accordance with Ser. No. 580,086 which can embody the present invention.

As will also be noted in FIG. 4, the apparatus 110 includes a cylindrical waveguide structure 120 formed from a wire mesh or screen. The waveguide structure 120 is disposed within the inner chamber 32 and preferably is closely spaced with respect to the drums 12. The waveguide structure 120 can be utilized to provide a more uniform and continuous waveguide structure and thereby provide more efficient propagation of the microwave energy within the inner chamber 32. However, the waveguide structure 120 will decrease the gas utilization efficiency of the system by a small amount inasmuch as deposition will take place on the waveguide structure 120.

Figure 5:
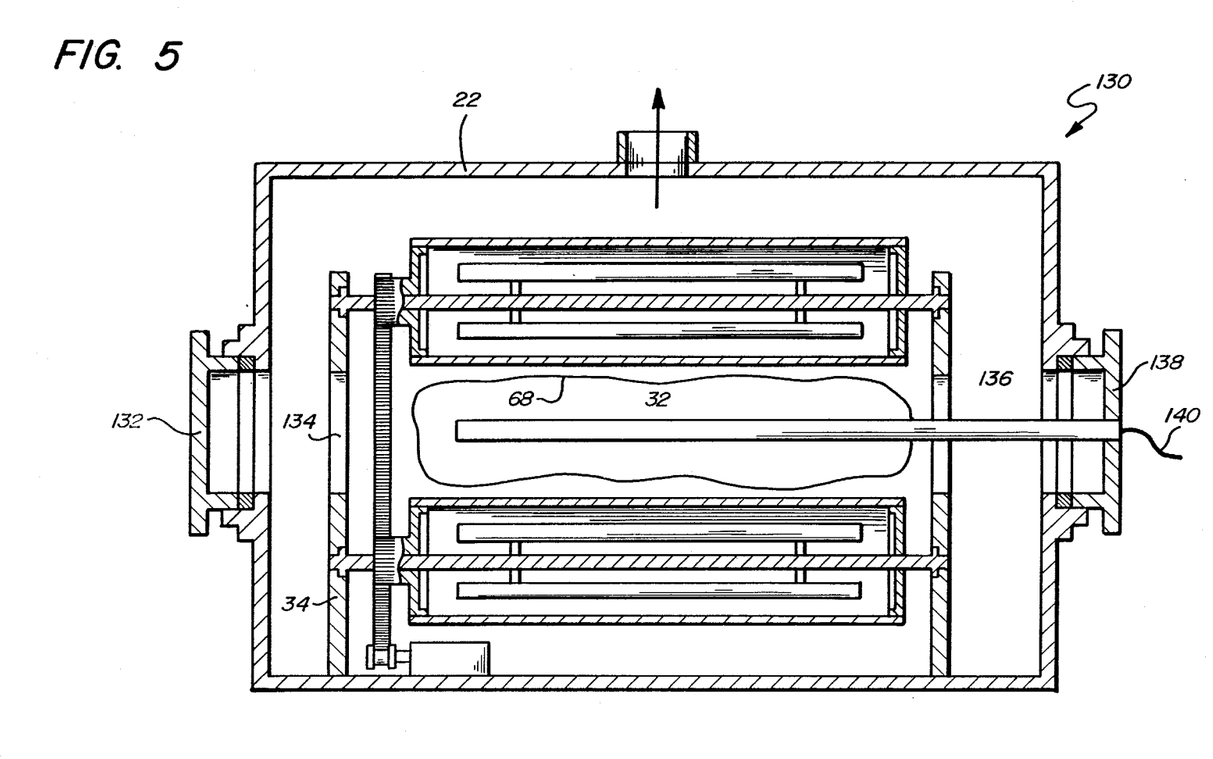
FIG. 5 is a side view, partly in cross section, of another apparatus in accordance with Ser. No. 580,086 which can embody the present invention which includes structure for introducing radio frequency energy into the inner chamber of the apparatus for forming the plasma therein.

Referring now to FIG. 5, it illustrates another apparatus 130 which again is substantially similar to the apparatus 20 of FIG. 2. Here however, as can be noted, both microwave magnetrons have been removed. A plate 132 replaces the magnetron 70 and waveguide 82. Another plate 134 closes the opening formed in the upstanding wall 34 when the waveguide 82 is removed.

At the other end of the chamber 22, an elongated antenna structure 136 is disposed within the inner chamber 32. The antenna 136 is supported on an insulative plate 138 and includes a lead 140 adapted to be connected to a source of radio frequency energy. The antenna 136 together with the plate 134 forms a means for coupling radio frequency energy into the inner chamber 32. This structure permits radio frequency energy to be utilized for forming the plasma 68 within the inner chamber 32. As previously mentioned, it may be desired to form the bulk of the photoconductive region 16 by a microwave glow discharge plasma and form the upper portion of the photoconductive region 16 by a plasma excited by radio frequency energy. The antenna 136 together with the plate 134 facilitates such an RF glow discharge plasma within the inner chamber 32.

In operating one or more deposition systems, such as 20, 110 or 130 or subsystems thereof, such as the gas cabinets or gas distribution cabinets, a standard or conventional malfunction configuration would always sequence to one predetermined safe operating or off configuration. This type of conventional fixed sequence malfunction system is applicable when there exists a single set of variables, such as a furnace off/on or a valve off/on or a door open/shut. Applicant has discovered that the conventional malfunction system is not, however, preferable when utilizing a plasma deposition or gas or other variable type of system, because the safe operating condition may not be fixed, but can depend upon the history of the system operation to that point.

For example, a plasma depositon system which has one or more inflamable or toxic gases therein, cannot just be shutdown and vented without knowing what the state of the residual gases in the system are. These can be gases trapped in the lines and between valves. A fixed sequence recovery system cannot account for these gases. Further, the gases in most conventional systems are not as toxic as those which can be utilized in a plasma deposition system. Another basic difference is the fact that plasma systems generally are batch or semi-batch type systems, which frequently are turned off and on and generally are very complex systems. The conventional prior art systems, such as furnaces, are not complex and are set up to operate in a substantially continuous mode.

Figure 6:
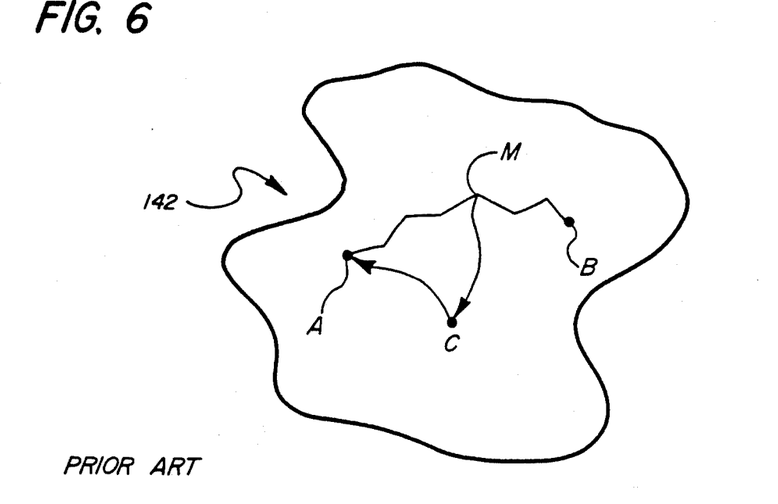
FIG. 6 is a schematic representation of the fixed sequence operation of a prior art malfunction system.

Also, and of potentially equal importance, a fixed safe operating point can be extremely wasteful. For example, in the operation of a conventional or prior art malfunction system 142, as illustrated in FIG. 6, a first condition can be a standby condition state A. The normal operating condition is a state B. The representation of the system 142 can be thought of as an operating space, with each location or state therein defining a particular set of machine conditions. If during the sequencing of the system 142 from condition A to condition B or while operating in condition B a malfunction (M) occurs, then the system always will be sequenced to a predetermined fixed position C. Once the malfunction is corrected, then the system typically will be sequenced back to condition A to totally restart the sequence to achieve the normal operating condition B.

Figure 7:
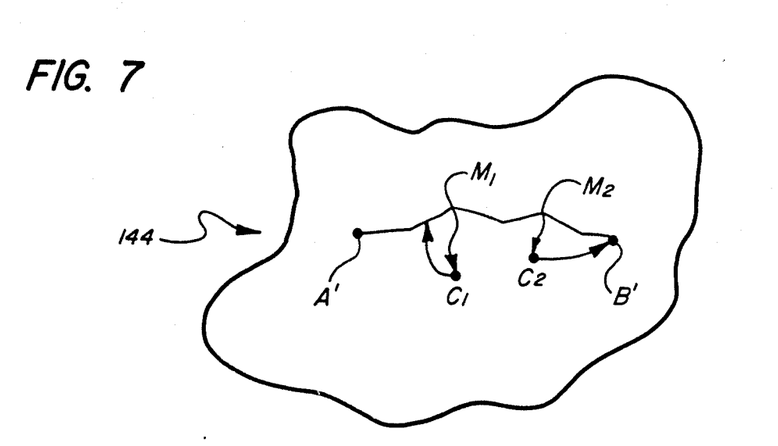
FIG. 7 is a schematic representation of the variable sequence operation of the malfunction system of the present invention.

In accordance with the invention, as illustrated in FIG. 7, each system state in the variable sequence operation of a malfunction system 144 can determine a different default state. Again, a first condition can be a standby condition state A' and a normal operating condition is a state B'. However, each default malfunction M1, M2, etc. determines different respective default states C1, C2, etc. Each of the default states C1, C2 will determine a different recovery sequence. One preferable sequence is back to the closest logical operating state in the sequence to achieve condition B' without returning to condition A', as illustrated by state C1. Another preferable sequence is illustrated by state C2, which then defines a new and least wasteful direct sequence to achieve the condition B'.

To achieve this operation, the invention includes monitoring each of the hardware states at each step in the system operation or the operating sequence. The hardware states are the actual conditions of the physical equipment, such as whether a valve is open or shut, a heater is on or off, flowmeter settings, etc. The invention further includes monitoring each of the actual states during the system operation or sequencing. The actual states are where the system is actually operating in response to being in a particular set of hardware states. For example, actual gas flows, actual substrate temperatures, type and pressure of process gas in various locations, such as between valves.

It should be clear from the above system descriptions that the actual states are not only a function of the latest hardware states imposed upon the system, but are also a function of the sequence and timing of the hardware states utilized prior to the current hardware states. The actual states are not necessarily steady states. To sequence the system from one operating state to another, such as from standby state A' to normal operating state B' involves sequencing the system through a large number of hardware states in the proper sequence and with the proper timing. This sequencing provides a fixed set of conditions for the proper system operation, which conditions generally are not too flexible.

The invention achieves its flexibility by storing each hardware state as a fixed data record. The sequencing then calls up each data record in the proper time sequence, once the previous state has been checked as being correct in both a hardware and actual sense. In other words, in normal operation, a new hardware state in the sequence can only be achieved after a specific previous sequence of hardware states has occurred. Further, the new hardware state must occur within a predetermined time interval after the previous state and the monitoring system must have confirmed that the last actual state matched the state expected from the last hardware state. Generally, a time limit is imposed on the existence of a hardware state and a match with the actual monitored state. Further, a backup state generally will be imposed for minor errors such as minor timing errors. All the system hardware data records are safe, i.e. a physical mismatch just does not exist.

Each of the operating states has a set malfunction sequence if a match between the hardware state and the actual states does not exist and the malfunction is not a predetermined minor error as noted above. The system then will be sequenced to a safe operating state C1, C2, etc., until the malfunction is corrected. Further, as above mentioned, the system 144 is then sequenced from each of the safe operating states C1, C2, etc. to the closest logical operating state to place the system back into the normal operating sequence with the least amount of lost time and energy.

Further, any time a malfunction occurs which has not previously been foreseen or sequenced for, the operator will update the sequencing for the new safe operating state C3 after the closest logical safe operating state has been determined. Likewise, a new return sequence will be determined by the operator to return the system to the closest logical operating state after the malfunction has been corrected. This then defines a new default recovery sequence for the system 144.

Figure 8:
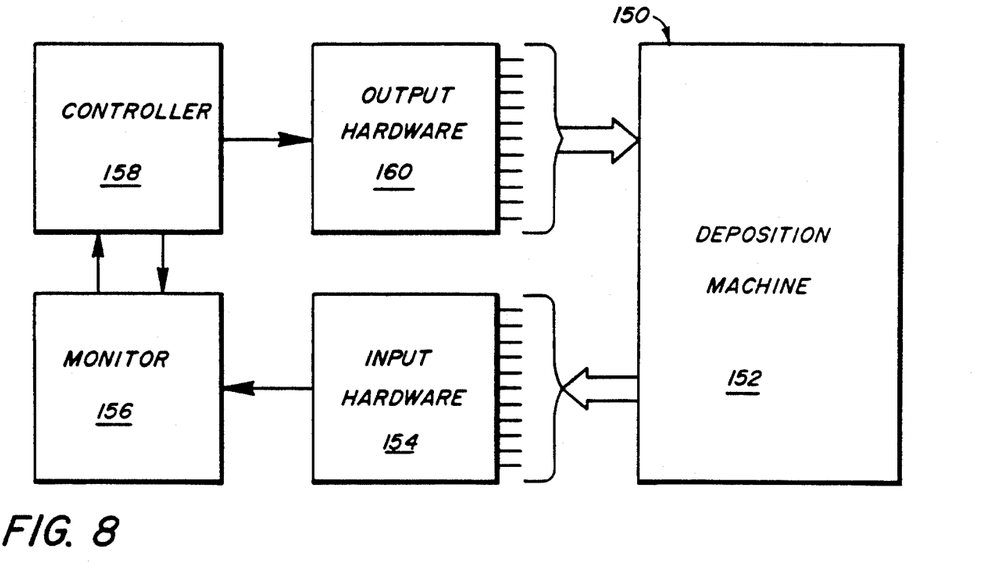
FIG. 8 is a block diagram of one system configuration which can embody the present invention.

One configuration 150 of the system is illustrated in FIG. 8. A deposition machine 152, such as those described above or any other multiple parameter deposition system is coupled to a set of monitoring or input hardware 154 which is coupled to a monitor 156. The monitor 156 in turn communicates with a controller 158. The controller sets the sequencing for the machine 152 by controlling appropriate output hardware 160 and communicates those states to the monitor 156. The sequencing and safe states are predetermined states in the controller 158 and can be interrupted or changed by an operator where appropriate.

Figure 9:
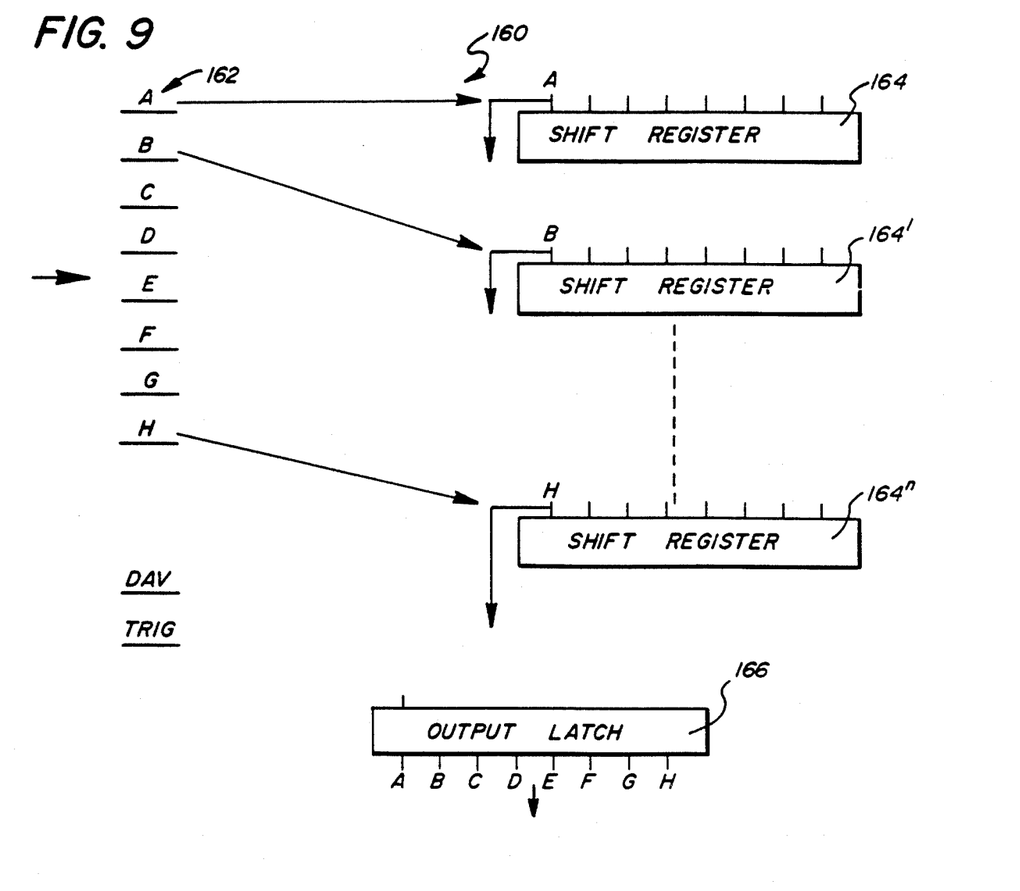
FIG. 9 is a block diagram of an input/output device of the present invention.

To facilitate the operation of the system 150 and to reduce the complexity thereof, a fixed data record input/output (I/O) device 160 can be utilized in accordance with another embodiment of the invention, as best illustrated in FIG. 9. Conventionally, I/O devices require addressing and hence decoding which adds complexity to the system. The I/O device 160 avoids such a complex system by utilizing the fixed logical states or data record described above to eliminate all addressing. For illustration purposes, an 8-bit data link 162 is described.

The I/O device 160 includes a plurality of shift registers connected into a shift register matrix. The eight bits of data (A, B ... H) are transferred to a first column pin of a plurality of shift registers 164, 164'-164$^n$, by a data valid signal DAV. The number of shift registers 164, etc., will be equal in number n to the number of bits n to be input and conventionally will have a like number of column data pins. Each of the sets of pins in the columns of the shift register 164, etc., will be coupled to an output latch 166 and the data will be transferred to the latch 166 by a trigger signal TRIG at the appropriate time interval. The latch 166 will remember the last eight bits of data which have been output.

The shift registers 164, etc. operate in a conventional fashion to shift each data bit serially to the next output pin as each new data bit is transferred to it from the data link 162. The last eight bits transferred by the data link 62 are remembered by the latch 164.

The output latches 166-166$^n$, corresponding to the shift register data bits 1−n (here n=eight), form the fixed data record which drives the machine 152. The eight bits of data in the link 162 can represent digital 0's or 1's indicating a particular hardware state, such as a particular valve is off/on or heater off/on, etc. Thus to change one of the hardware states in the machine 152, the controller 158 will update the particular bit or bits of data in the data record and then the whole data record is again output to the machine 152, which will change only the hardware states which are changed in the data record.

The matrix of the I/O device 160 can be daisy chained to form any length data record which is desired. The illustration given above is for eight-bit output data strings or a total of 64 bits of information in the data record. A particular set or sets of bits in the data link 162 and hence one or more of the output latches 166, also can be an analogue representation of a temperature, flow control or pressure setting.

The matrix of the I/O device 160 is daisy chained merely by adding a further shift register (not illustrated) for each of the shift registers 164-164$^n$. For example, a second eight-bit register can be chained to each of the registers 164-164$^n$ resulting in a 16-bit string of data, which additional registers will in turn be connected to respective output latches (also not illustrated). Thus, a data record of 128 bits can be formed. In a like manner, the I/O device 160 can be daisy chained to form any length data record. The system 150 can include a plurality of the I/O devices 160. Further, the device 154 can be the same as the I/O device 160 with the data or logic flow in the reverse direction.

Figure 10:
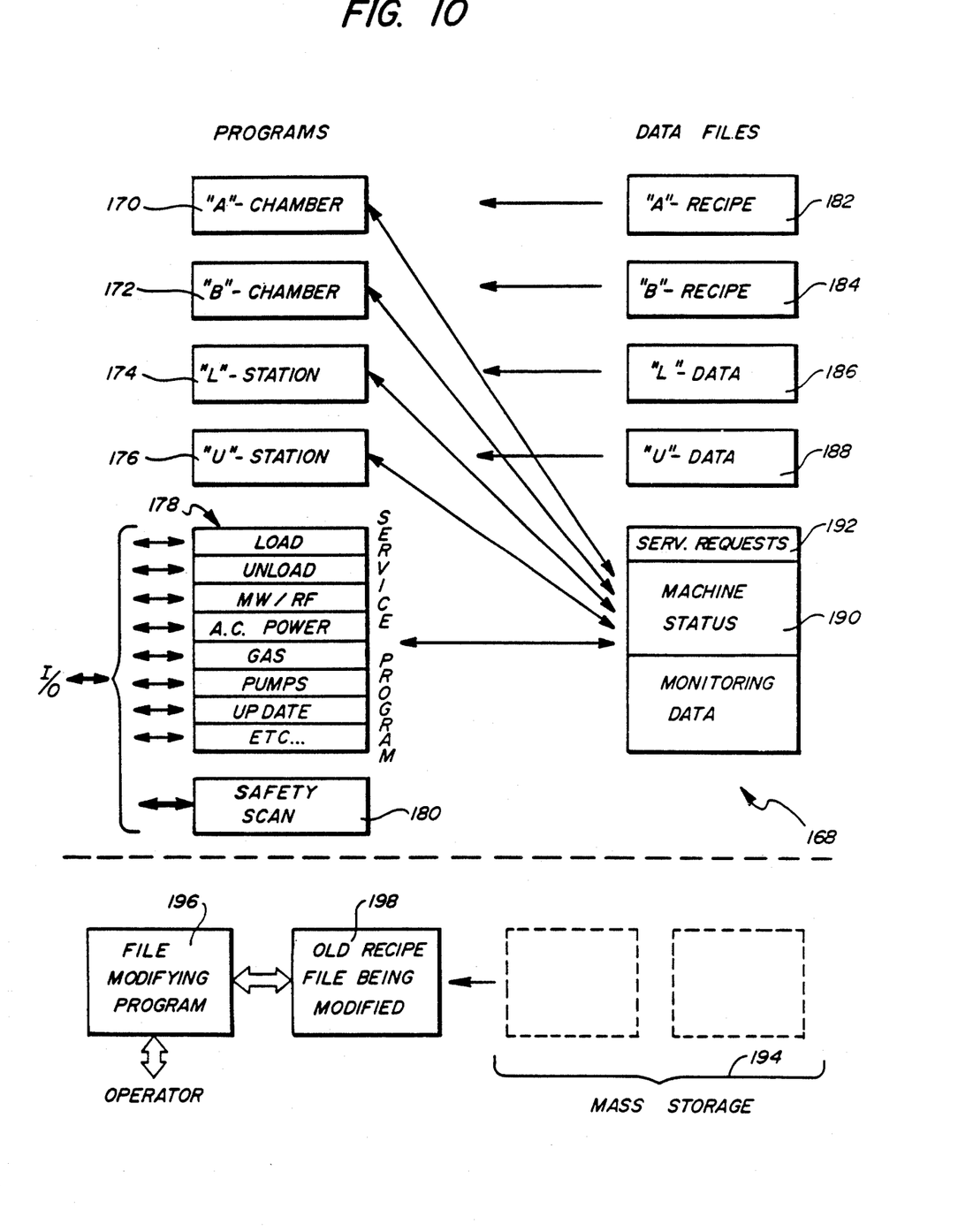
FIG. 10 is a block diagram of an improved flexible operating system.

An improved flexible operating system embodiment 168 of the present invention is best illustrated in FIG. 10. The system 168 can be utilized to provide flexibility in the operation of two or more deposition systems, here illustrated as an A deposition chamber 170 and a B deposition chamber 172. In a standard conventional operating system, the software generally is rather rigid. In these systems, the controller also makes the appropriate matches of the various operating states, hardware and actual states, before the next sequenced operation is performed, however, the sequence of such steps or events in a given operating or production cycle is usually predetermined and fixed. Therefore, there is little, if any, latitude for variations in the operating cycle, such as in special or developmental operating sequences. For these sequences, the deposition parameters, gases, flows, pressures, temperatures, times, etc., can vary widely. Even after a production sequence is set up, a special operating cycle can be desired for a particular product recipe.

This conventional fixed sequence operating cycle places severe constraints on the schedule of the production operators, since the time frame for various stages generally leaves very little extra time, such as for the manual loading or unloading of substrates. Complicated safeguards are generally set into the operating sequencing to ensure a proper operation if an operator delay occurs. These safeguards generally result in further operating delays.

To avoid the fixed sequence limitations of the conventional operating system, the flexible operating system 168 was developed. This system allows modifications and changes in the system operation without the need to modify and test new programs. The prior conventional system generally requires that the whole operating program or sequence be reprogrammed. The flexibility of the system 168 also could be achieved by utilizing a multiplicity of individual system controllers communicating on a high-speed data bus. This solution, however, is extremely expensive, still requires local programming and further provides the possibility that unforeseen and conflicting data bus requests can cause delays or a system crash with unpredictable results.

The system 168 provides the required flexibility without any major reprogramming by modularizing the operating programming sequence into logically separate subsystems or modules which communicate to one another utilizing software states. The specific system 168 described can be utilized with two or more deposition chambers 170 and 172, which can correspond to one or more of the systems 20, 110 or 130.

The first subsystem is the program for the A chamber 170. This program supervises all the deposition conditions in the chamber 170, such as what states the substrate such as the drums 12 are, i.e. coated, being coated or uncoated and what the status is of each of the other hardware states related only to chamber 170. The second subsystem is the program for the B chamber 172, which supervises only the chamber 172, in a like manner as the program for the chamber 170.

For this example, a load (L) station 174 is provided which is utilized to prepare the substrates for loading into the chamber 170 and 172. An unload (U) station 176 is provided to receive the coated substrates from the chambers 170 and 172. The programs for each of the stations 174 and 176 are again related only to their respective stations, but are less complex since less hardware states exist in these stations.

A service program 178 is also set for a plurality of auxiliary equipment sequences for support equipment utilized with the chambers 170 and 172 and the stations 174 and 176. Again, for the particular drum deposition example utilized, the following subprograms can be utilized as part of the service program 178. Other subprograms would be utilized with other systems. Where the movement of the drums 12 or other substrates is automated, a loading and unloading program can be utilized which controls a loading mechanism for loading and unloading the substrates into and from the chambers 170 and 172 and the stations 174 and 176. A microwave (MW) or radio frequency (RF) program controls the power supplied to the deposition chambers. An electrical power (AC Power) program controls the delivery of electrical power to the various parts of the system. A gas distribution program controls the reaction process gases supplied to the deposition chambers 170 and 172 as well as any necessary gases supplied to the stations 174 and 176. A pumps program controls the pumping stations and the pump out valves to maintain the required pressures throughout the system 168. An update program can be provided to control the operator displays and to periodically archive the monitored data. Numerous other programs also can be utilized to provide desired system features.

A safety scan program 180 is provided to monitor the toxic gases, the various power outputs, the gas scrubbing status and any manual emergency stop controls in the system 168. The program 180 takes control of all the I/O hardware states when any malfunction is sensed.

The operation of each of the chambers 170 and 172 and the stations 174 and 176 and their associated programs is also controlled by an associated data or recipe file. The chamber 170 has an A recipe file 182, which includes all the deposition parameters for the chamber 170. A change in the recipe and hence the structure of the device or material deposited in the chamber 170 is effected by changing only the data file 182. The shutdown of the chamber 170 is also achieved in the same fashion and thus the program for the chamber 170 need never be changed. Likewise, a recipe file 184 is established for all the deposition parameters of the B chamber 172. An L data file 186 and a U data file 188 are also established if necessary for the operation of the load and unload stations 174 and 176. The files 186 and 188 may not be maintained in a production system, since these operating parameters may remain unchanged.

A machine status file 190 contains the status of the system 168 in sufficient detail for any desired monitoring and recording function. Each status item is constantly updated by and only by its specific corresponding subsystem program enumerated above. However, each program has the capability of reading each of the status details in the file 190. A section of the file 190 will contain the actual process parameters in a format identical to the recipe file 182 and 184 such that a later comparison can be made if desired, between the requested deposition parameters or conditions and the actual resulting deposition conditions. Another section 192 of the file 190 is assigned to service request flags, as described below. The contents of the entire file 190 periodically is archived onto some type of mass data storage equipment 194.

This same logic requires that the I/O hardware should be supervised by one and only one of the programs or subprograms. The structure of the sequencing of the overall system into the modular units allows each of the separate programs to be individually tested. Further, the A chamber 170 and the B chamber 172 can operate totally uncorrelated processes and one can be shutdown for servicing without an interruption in the operation of the other chamber.

The changes in any of the process parameters for any of the chambers or stations are achieved by only changing its respective recipe file. A separate file modifying program 196 can be accessed by the operator. The program can be utilized to modify a copy 198 of an old recipe file. The modified recipe is then assigned to a chamber or station as desired and also is stored in the mass storage 194. The mass storage 194 will thus maintain a catalogue of all the recipes which have been utilized to deposit materials and/or to identify all devices which have been manufactured in the past.

As an example of the operation of the system 168, the A deposition chamber 170 has completed a deposition. The A program will set a flag in the Service Request file 192 to indicate that the substrates or drums are ready to be unloaded. The overall program control as it reads the status of the service subprograms in the program 178 will read the flag as it monitors the unload subprogram. The unload program then decides whether or not to unload the substrates. If the transfer mechanism is otherwise engaged, it will ignore the request until it is not busy, otherwise the request will be honored. The mechanism is then moved into position at the A chamber 170 and it notifies the unload subprogram that it is in place by flagging the unload status file. The unload subprogram will then set its busy flag to prevent any further motion and then proceeds to check the status of the various hardware states, to ensure they are in the proper status for the substrates to be unloaded.

A pump out request is then issued to evacuate the station 170. The pump out service request flag may or may not be honored, since a high priority is assigned to the pump out request. The unload subprogram waits until it is notified that the station 170 has been pumped out and then proceeds to unload the substrates from the chamber 170. This example, needless to say, is but a small portion of the operations which will occur in a fully automated plural chamber deposition cycle.

It is the assignment of the various priorities in the service request file 192 which are utilized to maximize the throughout of the system 168. Also, the operation of the system 168 will be set up to anticipate the next operation after analyzing all the information available during the system operation. For example, the unload mechanism can anticipate that the next operation will be to unload the B chamber 172 and can be moved to the proper location before the request is given. Further, other options can be built into the operating sequence to provide a fully flexible system.

In addition, although the present invention has been particularly described with respect to the formation of electrophotographic drums, it can be appreciated by those skilled in the art that the method and apparatus of the present invention can be utilized with any type of multiple parameter fault system, I/O system and any type of plurality of deposition systems. As a result of the foregoing, it can be seen that the present invention can be practiced in a manner otherwise than as specifically described herein.

What is described and claimed to be secured by Letters Patent of the United States is:

1. A method of providing a flexible multiple deposition operating system, said method comprising:
   providing at least two deposition system programs;
   providing a plurality of service system programs, each said service system program adapted to carry out at least one fabrication task of the deposition system program;
   providing a separate recipe file program, said recipe file program adapted to coordinate interaction between said deposition and service system programs;
   providing a control program which coordinates the interaction between the recipe file program and the deposition and service system program; and
   revising only said recipe file program to effect changes in said deposition and service system programs.

2. The method as defined in claim 1 including operating said two deposition systems entirely separately from one another.

3. The method as defined in claim 1 including independently controlling each of said deposition system programs and said service system programs by individual, respective operation programs, adapted to operate said system programs in a manner consistant with the deposition parameters of the recipe file program.

4. The method as definad in claim 1 including providing a priority for service system operations to maximize the system efficiency and flexibility.

5. An apparatus for providing a flexible, multiple deposition operating system, said apparatus comprising:
   at least two deposition system programs;
   said deposition system programs including a plurality of service system programs, each said service system programs adapted to carry out at least one fabrication task;
   each of said deposition and service system programs including a separate recipe file program adapted to coordinate interaction between said deposition and service system programs;
   control program means adapted to coordinate interaction between the recipe file program and the deposition and service system programs; and
   means for revising only said recipe file programs to effect changes in said deposition and service system programs.

6. The apparatus as defined in claim 5 including means for operating said two deposition systems entirely separately from one another.

7. The apparatus as defined in claim 5 including means for independently controlling each of said deposition system programs and said service system programs by individual, respective operation programs adapted to operate said system programs in a manner consistent with the deposition parameters of the recipe file program.

* * * * *